United States Patent
Iu et al.

(10) Patent No.: US 11,978,646 B2
(45) Date of Patent: May 7, 2024

(54) THERMAL CHAMBER WITH IMPROVED THERMAL UNIFORMITY

(71) Applicant: Applied Materials, Inc., Santa Clara, CA (US)

(72) Inventors: Dongming Iu, Union City, CA (US); Kartik Shah, Saratoga, CA (US); Norman L. Tam, Cupertino, CA (US); Matthew Spuller, Belmont, CA (US); Jau-Jiun Chen, San Jose, CA (US); Kong Lung Samuel Chan, Newark, CA (US); Elizabeth Neville, Palo Alto, CA (US); Preetham Rao, Bangalore (IN); Abhilash J. Mayur, Salinas, CA (US); Gia Pham, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 130 days.

(21) Appl. No.: 15/982,785

(22) Filed: May 17, 2018

(65) Prior Publication Data

US 2018/0337075 A1  Nov. 22, 2018

Related U.S. Application Data

(60) Provisional application No. 62/507,934, filed on May 18, 2017.

(51) Int. Cl.
*H01L 21/67* (2006.01)
*C23C 16/455* (2006.01)
(Continued)

(52) U.S. Cl.
CPC .. *H01L 21/67103* (2013.01); *C23C 16/45565* (2013.01); *C23C 16/4583* (2013.01);
(Continued)

(58) Field of Classification Search
CPC ......... H01L 21/67103; H01L 21/68735; H01L 21/6719; H01L 21/6875; H01L 21/68792;
(Continued)

(56) References Cited

U.S. PATENT DOCUMENTS 5,846,332 A * 12/1998 Zhao .................. C23C 16/4411
                                                                     118/728
6,364,954 B2 * 4/2002 Umotoy ............. C23C 16/4401
                                                                     118/715
(Continued)

FOREIGN PATENT DOCUMENTS

JP      2002367976 A    12/2002
KR   10-2001-0080758 A   8/2001
KR   10-2003-0063448 A   7/2003

OTHER PUBLICATIONS

International Search Report and Written Opinion dated Sep. 7, 2018 for Application No. PCT/US2018/033252.
(Continued)

*Primary Examiner* — Binu Thomas
(74) *Attorney, Agent, or Firm* — Patterson + Sheridan, LLP

(57) ABSTRACT

Embodiments of the disclosure generally relate to a semiconductor processing chamber. In one embodiment, semiconductor processing chamber is disclosed and includes a chamber body having a bottom and a sidewall defining an interior volume, the sidewall having a substrate transfer port (Continued)

formed therein, and one or more absorber bodies positioned in the interior volume in a position opposite of the substrate transfer port.

18 Claims, 6 Drawing Sheets

(51) Int. Cl.
 *C23C 16/458* (2006.01)
 *C23C 16/46* (2006.01)
 *C23C 16/56* (2006.01)
 *H01L 21/687* (2006.01)

(52) U.S. Cl.
 CPC .............. *C23C 16/46* (2013.01); *C23C 16/56* (2013.01); *H01L 21/6719* (2013.01); *H01L 21/68735* (2013.01); *H01L 21/68742* (2013.01); *H01L 21/6875* (2013.01); *H01L 21/68792* (2013.01); *H01L 21/67098* (2013.01)

(58) Field of Classification Search
 CPC ... H01L 21/68742; C23C 16/56; C23C 16/46; C23C 16/45565; C23C 16/4583; F27D 5/00
 USPC ............ 118/728, 729; 156/345.23; D13/179, D13/182
 See application file for complete search history.

(56) References Cited

U.S. PATENT DOCUMENTS

| | | | |
|---|---|---|---|
| 6,962,644 B2 | 11/2005 | Paterson et al. | |
| 9,698,074 B2 | 7/2017 | Merry et al. | |
| 2004/0137398 A1 | 7/2004 | Goodman | |
| 2008/0178797 A1* | 7/2008 | Fodor | C23C 16/46 118/75 |
| 2009/0155025 A1 | 6/2009 | Lerner et al. | |
| 2009/0314208 A1* | 12/2009 | Zhou | H01L 21/68792 118/723 R |
| 2010/0008656 A1 | 1/2010 | Sorabji et al. | |
| 2012/0240853 A1* | 9/2012 | Carlson | C23C 16/45578 118/715 |
| 2013/0259457 A1 | 10/2013 | Yokouchi et al. | |
| 2014/0345526 A1* | 11/2014 | Ranish | H01L 21/02293 118/715 |

OTHER PUBLICATIONS

Korean application in related application KR 1020197031404 dated Dec. 17, 2020.
Taiwan Official Letter in related application TW 107116999, dated Sep. 17, 2021.

* cited by examiner

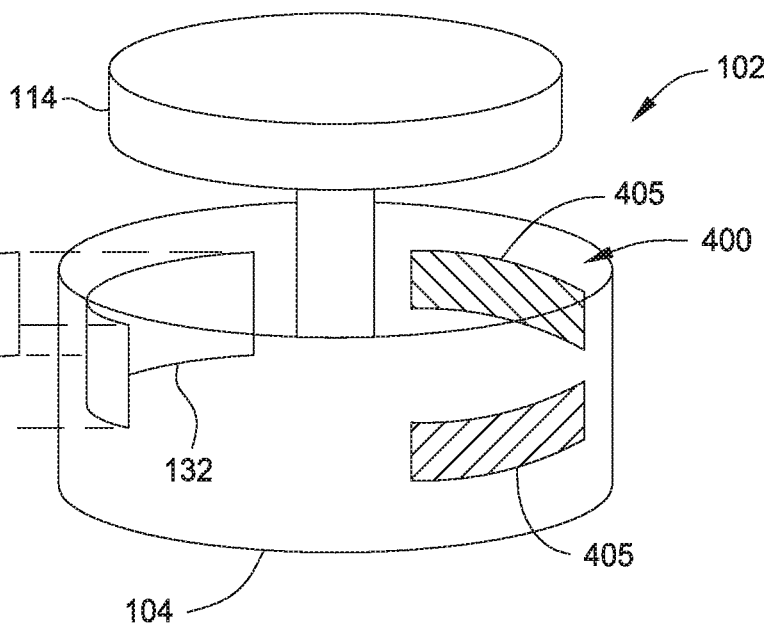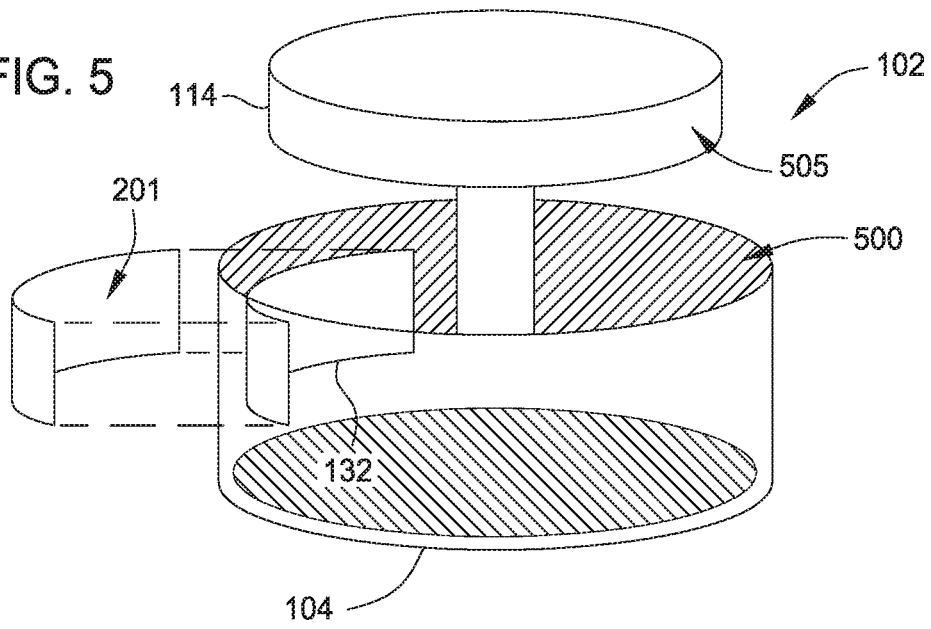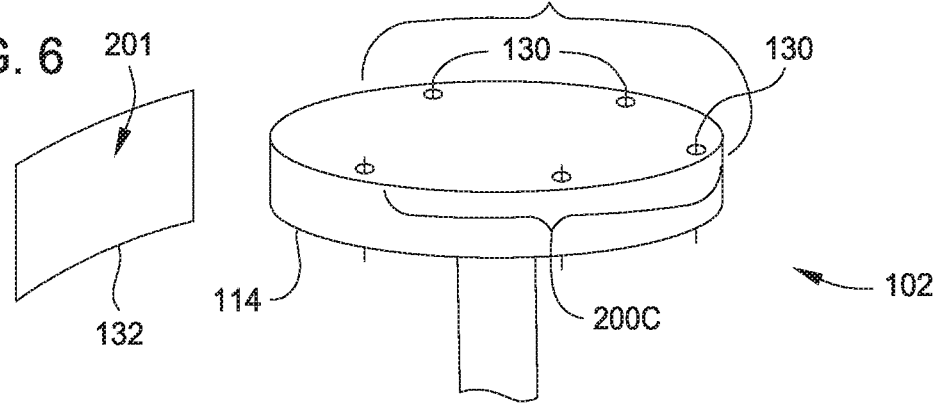

THERMAL CHAMBER WITH IMPROVED THERMAL UNIFORMITY

CROSS-REFERENCE TO RELATED APPLICATION

This application claims benefit of U.S. Provisional Patent Application Ser. No. 62/507,934, filed May 18, 2017, which application is hereby incorporated by reference herein.

BACKGROUND

Field

Embodiments disclosed herein generally relate to a semiconductor processing chamber and, more specifically, a thermal treatment chamber, such as an annealing chamber.

Description of the Related Art

In the manufacture of electronic devices on a substrate, substrates, such as a semiconductor substrate, are subjected to many thermal processes. The thermal processes are typically performed in a dedicated processing chamber where material is deposited or removed, or a substrate is heated in a controlled manner. Such processes include epitaxial deposition, chemical vapor deposition (CVD), plasma enhanced chemical vapor deposition (PECVD), etching, annealing, and the like.

A substrate is typically supported in the processing chamber and exposed to a heat source to raise the temperature of the substrate. However, portions of the processing chamber may act as a heat sink which prevents portions of the substrate to be heated at the same rate as other portions thereof. This results in temperature non-uniformity of the substrate being heated.

Thus, there is a need for an improved thermal uniformity in thermal processing chambers.

SUMMARY

Embodiments of the disclosure generally relate to a semiconductor processing chamber. In one embodiment, semiconductor processing chamber is disclosed and includes a chamber body having a bottom and a sidewall defining an interior volume, the sidewall having a substrate transfer port formed therein, and one or more absorber bodies positioned in the interior volume in a position opposite of the substrate transfer port.

In another embodiment, a semiconductor processing chamber is provided that includes a chamber body having a bottom and a sidewall defining an interior volume, the sidewall having a substrate transfer port formed therein, a substrate support disposed in the interior volume, and one or more absorber bodies positioned in the interior volume about the substrate support in a position opposing the substrate transfer port.

In another embodiment, a semiconductor processing chamber is provided that includes a chamber body having a bottom and a sidewall defining an interior volume, the sidewall having a substrate transfer port formed therein, and a substrate support disposed in the interior volume, the substrate support including a first segment facing the substrate transfer port, and a second region and a third region adjacent to the first region, wherein one or more absorber bodies are positioned in the interior volume adjacent to the second region and the third region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is a schematic isometric view of a substrate support assembly and chamber body (shown in phantom) that may be used in the substrate processing system of FIG. 1, having another embodiment of a liner.

FIG. 5 is a schematic isometric view of a chamber body that may be used in the substrate processing system of FIG. 1.

FIG. 6 is a schematic isometric view of another embodiment of a substrate support assembly that may be used in the substrate processing system of FIG. 1, a chamber body surrounding the substrate support assembly is not shown.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to a semiconductor processing chamber and, more specifically, a thermal processing chamber. Embodiments disclosed herein are illustratively described below in reference to anneal chambers. Examples of substrate processing systems that may be adapted to benefit from the embodiments described herein include a PRODUCER® SE CVD system, a PRO- DUCER® GT™ CVD system or a DXZ® CVD system, all of which are commercially available from Applied Materials, Inc., Santa Clara, California. The Producer® SE CVD system (e.g., 200 mm or 300 mm) has two isolated processing regions that may be used to anneal substrates. Although the exemplary embodiment includes two processing regions, it is contemplated that the embodiments described herein may be used to advantage in systems having a single processing region or more than two processing regions. It is also contemplated that the embodiments described herein may be utilized to advantage in other thermal processing chambers, such as plasma chambers, etch chambers, ion implantation chambers, annealing chamber, and stripping chambers, among others. It is further contemplated that the embodiments described herein may be utilized to advantage in processing chambers available from other manufacturers.

Embodiments of the processing chamber described herein address the need for temperature control of a substrate during processing. Certain embodiments described herein provide a greater degree of temperature control when heating a substrate from at about room temperature to temperatures at or above 400° C. with a minimal within-substrate temperature gradient (about 10° C., or less, such as about 7° C.).

Figure 1:
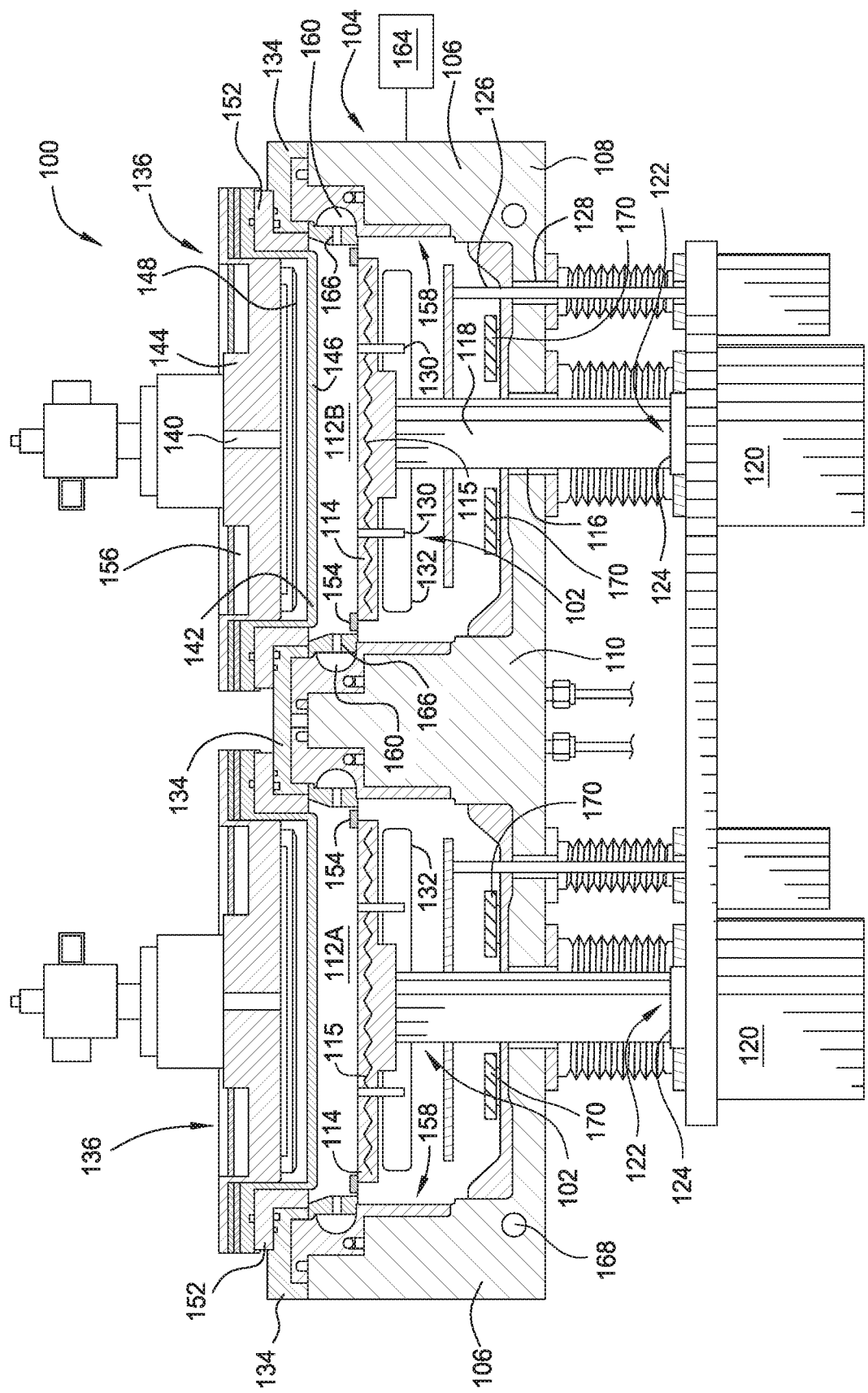
FIG. 1 is a partial cross sectional view of an exemplary substrate processing system.

FIG. 1 is a partial cross sectional view of an exemplary substrate processing system 100 having a substrate support assembly 102 according to embodiments described herein. As described herein, the substrate support assembly 102 comprises an active heating system which allows for active control of the temperature of a substrate positioned on the substrate support assembly 102 over a wide temperature range while the substrate is subjected to numerous process and chamber conditions. The system 100 generally includes a processing chamber body 104 having sidewalls 106, a bottom wall 108, and an interior sidewall 110 defining a pair of processing regions 112A and 112B. Each of the processing regions 112A-B is similarly configured, and for the sake of brevity, only components in the processing region 112B will be described.

A substrate support body 114 is disposed in the processing region 112B through a passage 116 formed in the bottom wall 108 of the chamber body 104. The substrate support body 114 is adapted to support a substrate (not shown) on the upper surface thereof. In some embodiments, the substrate support body 114 may comprise a vacuum chuck. The substrate support body 114 may include heating elements 115, for example resistive heating elements, to heat and control the substrate temperature at a desired process temperature. Each of the heating elements 115 may be utilized to heat a substrate (not shown) positioned on or above an upper surface of the substrate support body 114. The heating provided by the heating elements 115 may heat a substrate from about room temperature to about 500° C., or greater. The substrate support body 114 may be made of aluminum nitride or another ceramic material.

The substrate support assembly 102 includes the substrate support body 114 that is coupled to a shaft 118. In this way, the substrate support assembly 102 may be a pedestal. The shaft 118 couples to a power outlet or power box 120, which may include a drive system that controls the elevation and movement of the substrate support body 114 within the processing region 112B. The shaft 118 also contains electrical power interfaces to provide electrical power to the substrate support body 114. The shaft 118 also includes a coolant channel formed therein. The power box 120 also includes interfaces for electrical power and temperature indicators, such as a thermocouple interface. The shaft 118 also includes a base assembly 122 adapted to detachably couple to the power box 120. A circumferential ring 124 is shown above the power box 120. In one embodiment, the circumferential ring 124 is a shoulder adapted as a mechanical stop or land configured to provide a mechanical interface between the base assembly 122 and the upper surface of the power box 120.

A rod 126 is disposed through a passage 128 formed in the bottom wall 108 and is utilized to activate substrate lift pins 130 disposed through the substrate support body 114. The substrate lift pins 130 selectively space a substrate from the substrate support body 114 to facilitate exchange of the substrate with a robot (not shown) utilized for transferring the substrate into and out of the processing region 112B through a substrate transfer port 132 (e.g., a slit valve coupled to a slit valve tunnel).

The substrate processing system 100 may include a chamber lid 134 that is coupled to a top portion of the chamber body 104. The lid 134 accommodates one or more gas distribution systems 136 coupled thereto. The gas distribution system 136 includes a gas inlet passage 140 which may deliver process gases through a showerhead assembly 142 into the processing region 112B. The showerhead assembly 142 may include an annular base plate 144 having a blocker plate 148 disposed intermediate to a reflective faceplate 146. The reflective faceplate 146 may be perforated to allow gases to flow therethrough. A thermal isolator 152 is disposed between the lid 134 and showerhead assembly 142. A shadow ring 154 may be disposed on the periphery of the substrate support body 114 that engages a substrate at a desired elevation of the substrate support body 114.

Optionally, a cooling channel 156 is formed in the annular base plate 144 of the gas distribution system 136 to cool the annular base plate 144 during operation. A heat transfer fluid, such as water, ethylene glycol, a gas, or the like, may be circulated through the cooling channel 156 such that the base plate 144 is maintained at a predefined temperature.

The processing regions 112A and 112B include interior sidewalls 158 which may be the surface of sidewalls 110, 106 of the chamber body 104. A circumferential pumping cavity 160 that is coupled to a pumping system 164 configured to exhaust gases and byproducts from the processing regions 112A and 112B and control the pressure within the processing regions 112A and 112B. A plurality of exhaust ports 166 may be in fluid communication with the pumping cavity 160. The exhaust ports 166 are configured to allow the flow of gases from the processing regions 112A and 112B to the circumferential pumping cavity 160 in a manner that promotes processing within the system 100. Additionally, a coolant channel 168 may be utilized to cool the chamber body 104.

In one example of an annealing process, a substrate (not shown) may be transferred through the substrate transfer port 132 onto the substrate lift pins 130 which space the substrate from the substrate support body 114 (e.g., about 1 millimeter). The substrate may be preheated for a specified period of time while being supported by the substrate lift pins 130 above the substrate support body 114. The preheat period may be a transient heating period. The preheating process may be utilized to prevent rapid heating of the substrate which may distort the substrate. After the preheat process, the substrate lift pins 130 may be retracted such that the substrate rests on the substrate support body 114 for a further heating process (steady-state heating).

During both of these heating processes, temperature uniformity within the substrate is desirable. However, interior portions of the chamber may act as a heat sink to where thermal energy from the substrate support body 114 may be transferred, which makes other portions hotter. For example, the interior sidewalls 158 may be reflective and may serve to reflect the thermal energy from the substrate support body 114 to the substrate. However, the sidewalls 158 are not uniform, for example, the area occupied by the substrate transfer port 132, and therefore conditions for thermal uniformity are not uniform. For example, in the area occupied by the substrate transfer port 132, no reflection may occur and an edge of a substrate near the substrate transfer port 132 may be cooler than other portions of the substrate. In FIG. 1, one option to compensate for this non-uniformity is a liner 170 (shown in cross-section) in or on an area of the chamber body 104 opposing the substrate transfer port 132.

Figure 8:
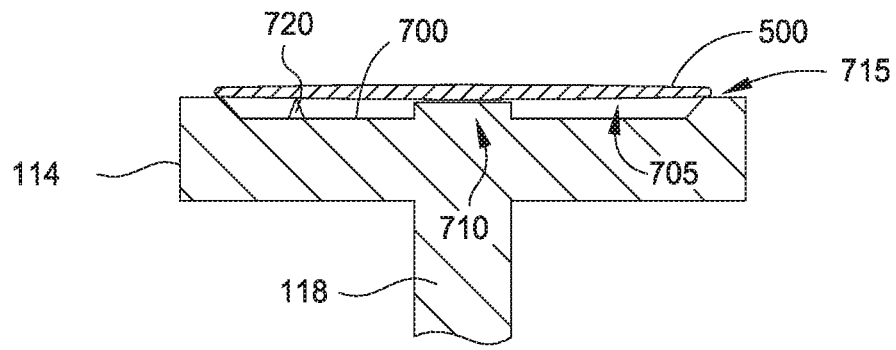
FIG. 8 is a schematic cross-sectional view of one embodiment of a substrate support body that may be used in the substrate processing system of FIG. 1.
Figure 9:
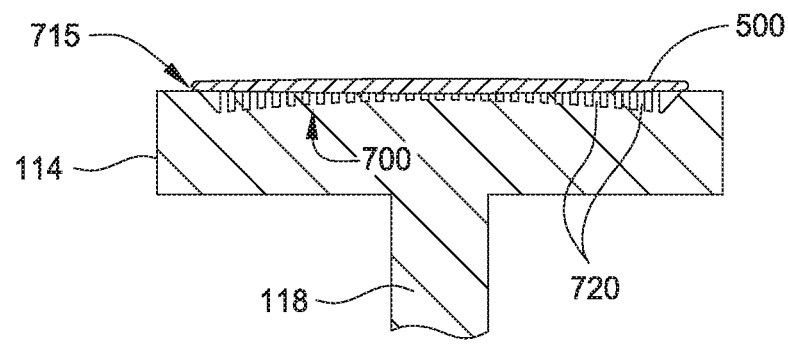
FIG. 9 is a schematic cross-sectional view of another embodiment of a substrate support body that may be used in the substrate processing system of FIG. 1.

The following figures are examples of options to compensate for this non-uniformity of temperature in a substrate. FIGS. 2-7 illustrate embodiments of the chamber body 104 that may be utilized to facilitate temperature uniformity of a substrate during a preheat process as described above (i.e., when the substrate is preheated while being spaced away form an upper surface of the substrate support body 114 using the substrate lift pins 130). FIGS. 8-9 are illustrations of embodiments where modifications of the substrate support body 114 may be used to facilitate temperature uniformity of a substrate during a steady-state heating process as described above.

Figure 2:
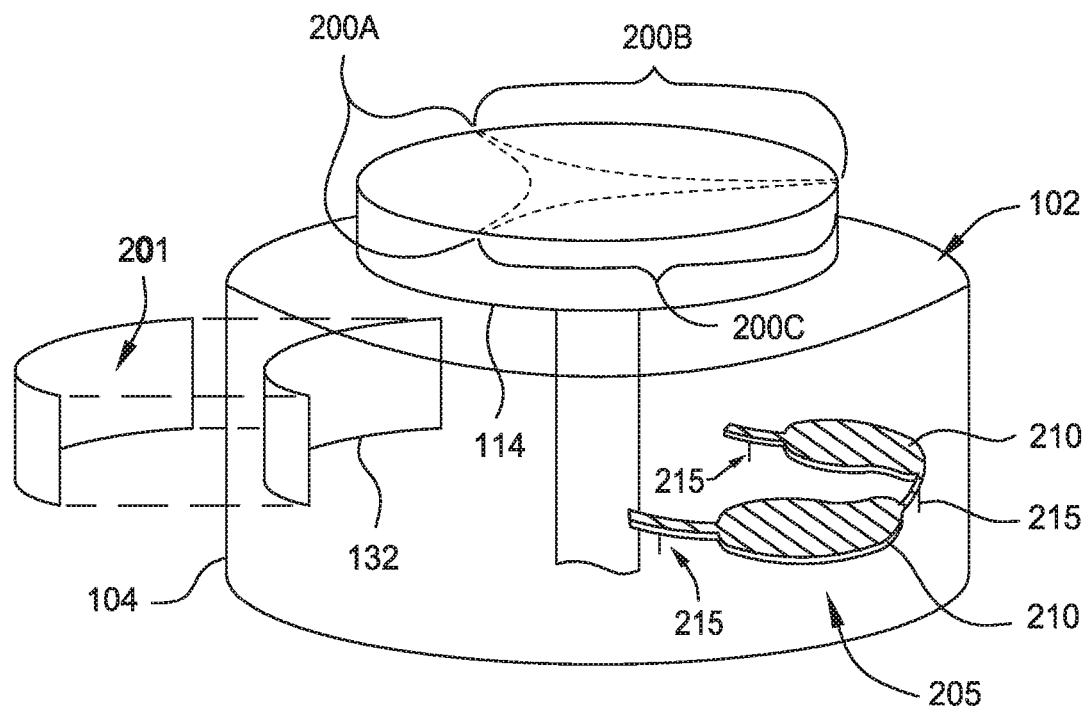
FIG. 2 is a schematic isometric view of a substrate support assembly and chamber body (shown in phantom) that may be used in the substrate processing system of FIG. 1 having one embodiment of a liner.

FIG. 2 is a schematic isometric view of a substrate support assembly 102 that may be used in the substrate processing system 100 of FIG. 1. The chamber body 104 is shown in phantom in order to more clearly show an interior volume that is coupled to a slit valve tunnel 201.

A substrate (not shown) may be transferred onto a surface of the substrate support body 114. During a preheat process as described above, the substrate may be spaced away from the upper surface of the substrate support body 114 as described above. Brackets and dashed lines are shown on the substrate support body 114 to indicate peripheral (outer) segments 200A, 200B and 200C (roughly 120 degree segments) where the supported substrate may be have a temperature different than other portions thereof due to conditions within the chamber. For example, the segment 200A adjacent to the substrate transfer port 132 may be cooler than other portions of the chamber body 104. The reasons for this relative cooling may be due to the lack of a reflective surface from the interior sidewalls 158 (shown in FIG. 1) of the chamber body 104. This cooler area may result in the portions of the substrate adjacent to the segments 200B and 200C being hotter relative to the portion of the substrate adjacent to segment 200A. For example, the portions of the substrate adjacent to the segments 200B and 200C may sag due to the temperature difference.

In order to compensate for this cooler area and/or improve temperature uniformity of a substrate being heated on the substrate support body 114, a liner 205 may be positioned in an opposing relationship to the substrate transfer port 132. The liner 205 may act as a heat sink for the portions of the substrate adjacent to the segments 200B and 200C during heating. For example, the liner 205 may cool the substrate edge adjacent to segments 200B and 200C. The liner 205 may also counterbalance the cooling effect of the substrate transfer port 132 on a substrate on the opposite side of the substrate support body 114 (e.g., adjacent to segment 200A).

In the embodiment shown, the liner 205 includes one or more members 210 made of a dark material, such as anodized aluminum. The liner 205 may be dark brown or black in color and may resemble a black body (i.e., a color that absorbs infrared radiation in the 2 micron to 7 micron range). The liner 205 is an absorber body that absorbs radiation at a higher rate than surrounding materials such as the chamber wall or chamber floor. The liner 205 may have absorption characteristics that mimic the heat removal characteristics of the substrate transfer port 132. Each of the one or more members 210 may be arc-shaped. Each of the members 210 may resemble a kidney-bean shape in plan view. When two members 210 are utilized together, the assembly may resemble a horseshoe in plan view (i.e., viewed from above). Depending on the angular (azimuthal) extent of the liner 205, the liner may have an arc shape, or any other shape. Each of the one or more members 210 may include stand-off pins 215 that will contact an interior surface of the bottom wall 108 (shown in FIG. 1). The stand-off pins 215 may serve to space the members 210 away from the surface of the bottom wall 108 by about 2-5 millimeters. This spacing away may be utilized to prevent particle generation that may be caused by differences in coefficients of expansion of the material of the members 210 and the material of the chamber body 104. The stand-off pins 215 may also be used as alignment features which interface with corresponding depressions formed in the bottom of the chamber. Each of the stand-off pins 215 may be made of stainless steel or other process resistant material.

Each member(s) 210 may have a thermally operative (wide/thick) portion and one or more support (narrow/thin) portions. The thermally operative portions may have a radial extent or thickness of about 60-70 mm and an axial (vertical) extent or thickness of 8-12 mm. The angular (azimuthal) extent of each thermally operative portion may be about 30-70 degrees. The support portion(s) extend from the ends of the thermally operative portion(s) and may connect two or more thermally operative portions together. The support portions may have radial extent of about 10-15 mm, an axial extent of 8-12 mm (substantially equal to that of the thermally operative portion(s)), and azimuthal extent of about 10-20 degrees. In one embodiment, there are two thermally operative portions connected by a support portion, with additional support portions at the opposite ends of the thermally operative portions. In some embodiments, therefore, the liner 205 has an angular (azimuthal) extent of 80-150 degrees, such as 100-140 degrees, for example 120 degrees.

Figure 3:
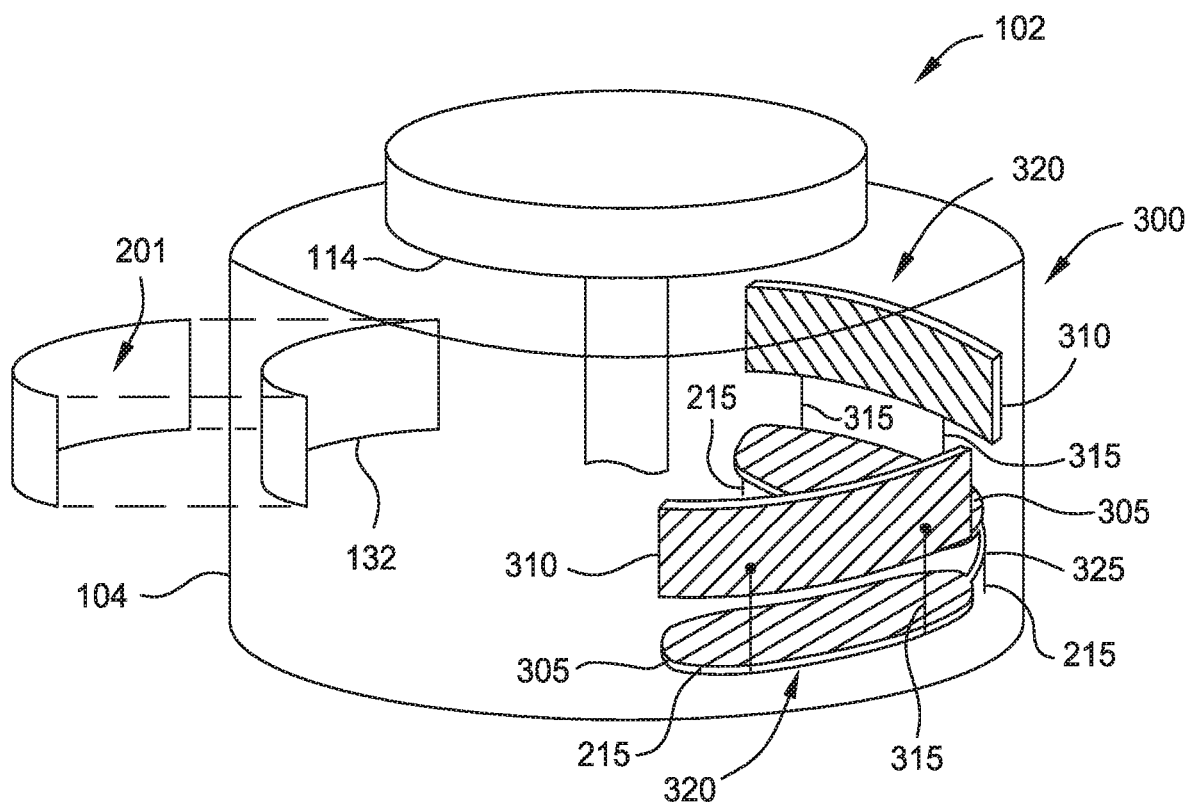
FIG. 3 is a schematic isometric view of a substrate support assembly and chamber body (shown in phantom) that may be used in the substrate processing system of FIG. 1, having another embodiment of a liner.

FIG. 3 is a schematic isometric view of a substrate support assembly 102 that may be used in the substrate processing system 100 of FIG. 1. The chamber body 104 is shown in phantom in order to more clearly show an interior volume that is coupled to a slit valve tunnel 201.

In this embodiment, a liner assembly 300 is shown, which may be used to compensate for the cooler area described in FIG. 2 and/or improve temperature uniformity of a substrate being heated on the substrate support body 114. The liner assembly 300 may be positioned opposite from the substrate transfer port 132. The liner assembly 300 may act as a heat sink for the portions of the substrate adjacent to the segments 200B and 200C (shown in FIG. 2) during heating. For example, the liner 205 may cool the substrate edge adjacent to segments 200B and 200C. The liner 205 may also counterbalance the cooling effect of the substrate transfer port 132 on a substrate on the opposite side of the substrate support body 114.

In the embodiment shown, the liner assembly 300 may be one or more members 305 and 310 of a dark material, such as anodized aluminum. The members 305, 310 may be dark brown or black in color and may resemble a black body (i.e., a color that absorbs infrared radiation in the 2 micron to 7 micron range). Similar to the liner 205, one or more of the members 305 and 310 of the liner assembly 300 are absorber bodies, as described above in connection with FIG. 2. Each of the one or more members 305, 310 may be arc-shaped. When two members 305 are utilized together, the liner assembly 300 may resemble a horseshoe in plan view. Depending on the angular (azimuthal) extent of the liner assembly 300, the liner assembly 300 may have an arc shape, or any other shape. Each of the members 305 may be coupled to the members 310 by a support member 315 to form a sub-assembly 320. The sub-assemblies 320 may be coupled together by a coupling member 325. The support members 315 and the coupling member may be stainless steel. Each of the sub-assemblies 320 may resemble an L shape in elevation view. While two sub-assemblies 320 are shown, the liner assembly 300 may comprise a single structure (one-piece).

The members 305 have length and width in a plane substantially parallel to the supporting surface of the substrate support assembly 102. The members 310 have an arcuate length progressing along a circumference of an inner surface of the chamber, and a linear width parallel to an axis of the chamber, each member 310 with two curved edges. In some embodiments, the members 305 have a linear width of about 20 to 60 mm, and an angular (azimuthal) dimension of about 100-140 degrees. In some embodiments, the members 310 have a linear width of about 20 to 60 mm, and an angular (azimuthal) dimension of about 100-140 degrees. The angular or azimuthal dimension may be from 80-150 degrees in some embodiments. The support members 315 proceed from the members 305 to the members 310 substantially parallel to a width direction of the members 310. Each sub-assembly 320 includes two support members 315, each of which may be attached to an edge of the member 305 facing the chamber sidewall and a side of the member 310 facing the chamber sidewall. Each of the support members 315 extends from the member 305, substantially perpendicular to the plane of the length and width of the member 305, and substantially parallel to the width direction of the member 310, to a point centrally spaced between the curved edges of the member 310. Azimuthal or angular extent of the liner assembly 300 may be 80-150 degrees, such as 100-140 degrees, for example 120 degrees.

FIG. 4 is a schematic isometric view of a substrate support assembly 102 that may be used in the substrate processing system 100 of FIG. 1. The chamber body 104 is shown in phantom to more clearly show an interior volume that is coupled to a slit valve tunnel 201 via the substrate transfer port 132.

In this embodiment, a liner assembly 400 is shown, which may be used to compensate for the cooler area described in connection with FIG. 2 and/or improve temperature uniformity of a substrate being heated on the substrate support body 114. The liner assembly 400 may be positioned opposite from the substrate transfer port 132. The liner assembly 400 may act as a heat sink for the portions of the substrate adjacent to the segments 200B and 200C (shown in FIG. 2) during heating. For example, the liner assembly 400 may cool the substrate edge adjacent to segments 200B and 200C. The liner assembly 400 may also counterbalance the cooling effect of the substrate transfer port 132 on edges of a substrate side of the substrate support body 114 opposite the substrate transfer port 132.

In the embodiment shown, the liner assembly 400 may be one or more cylindrical inserts 405 of a dark material, such as anodized aluminum. The cylindrical inserts 405 may be dark brown or black in color and may resemble a black body (i.e., a color that absorbs infrared radiation in the 2 micron to 7 micron range). As with the liner 205 and the liner assembly 300, the cylindrical inserts 405 of the liner assembly 400 are absorber bodies. Each of the cylindrical inserts 405 may be arc-shaped and are adapted to couple to interior sidewalls 158 (shown in FIG. 1) of the chamber body 104. In some embodiments, the cylindrical inserts 405 are coupled to the interior sidewalls 158 (shown in FIG. 1) of the chamber body 104 by fasteners, or a thermally stable adhesive. While two cylindrical inserts 405 are shown, the liner assembly 400 may comprise a single structure (one-piece). In some embodiments, the members 405 have a linear width of about 20 to 60 mm, and together have an angular (azimuthal) dimension of about 100-140 degrees.

The liner 205, liner assembly 300, and liner assembly 400 may have a radial extent selected to provide a desired thermal mass and/or absorption cross-section. A surface of the liners facing the substrate support assembly 102 may be located at a specified radius of the chamber to achieve an absorption cross-section that is selected to absorb a desired flux of thermal radiation. The radius may be varied, or the dimension of the surface facing the substrate support assembly 102 may be varied, to achieve the desired absorption cross-section. Additionally, the radial extent of the liner 205, the liner assembly 300, or the liner assembly 400 may be varied to change the thermal mass of the liner in order to provide a desired radiation absorption characteristic. Finally, more than one liner 205, liner assembly 300, or liner assembly 400 may be used.

FIG. 5 is a schematic isometric view of a chamber body 104 that may be used in the substrate processing system 100 of FIG. 1. The chamber body 104 is shown in phantom to more clearly show an interior volume that is coupled to a slit valve tunnel 201 via the substrate transfer port 132.

In this embodiment, a liner assembly 500 is shown, which may be used to compensate for the cooler area described in connection with FIG. 2 and/or improve temperature uniformity of a substrate being heated on the substrate support body 114. The liner assembly 500 covers interior walls and/or interior surfaces of a bottom of the chamber body 104 with the exception of the substrate transfer port 132. The liner assembly 500 is a dark material, such as anodized aluminum. The liner assembly 500 may be dark brown or black in color and may resemble a black body (i.e., a color that absorbs infrared radiation in the 2 micron to 7 micron range).

The liner assembly 500 of FIG. 5 is thermally absorptive in order to reduce heat flux from reflecting back to a circumferential surface 505 of the substrate support body 114. In the conventional substrate supports, areas of a substrate positioned thereon adjacent to the shaft are center cold but the liner assembly 500 reduces this center cold effect by acting as a heat sink. Thus, the liner assembly 500 enhances thermal uniformity of the substrate support body 114.

FIG. 6 is a schematic isometric view of a substrate support assembly 102 that may be used in the substrate processing system 100 of FIG. 1. The chamber body 104 is not shown in order to more clearly show an interior volume that is coupled to a slit valve tunnel 201.

In this embodiment, additional substrate lift pins 130 may be utilized to facilitate temperature uniformity of a substrate during a preheat process as described above. For example, substrate lift pins 130 may be added disproportionally to the substrate support body 114. It has been observed that the substrate lift pins 130 act as heat sinks in which thermal energy is removed from the substrate. In the embodiment shown, additional substrate lift pins 130 are provided to support portions of the substrate adjacent to the segments 200B and 200C. This may prevent sagging at the substrate edge corresponding to the segments 200B and 200C and/or promote more uniform temperatures therein.

Figure 7:
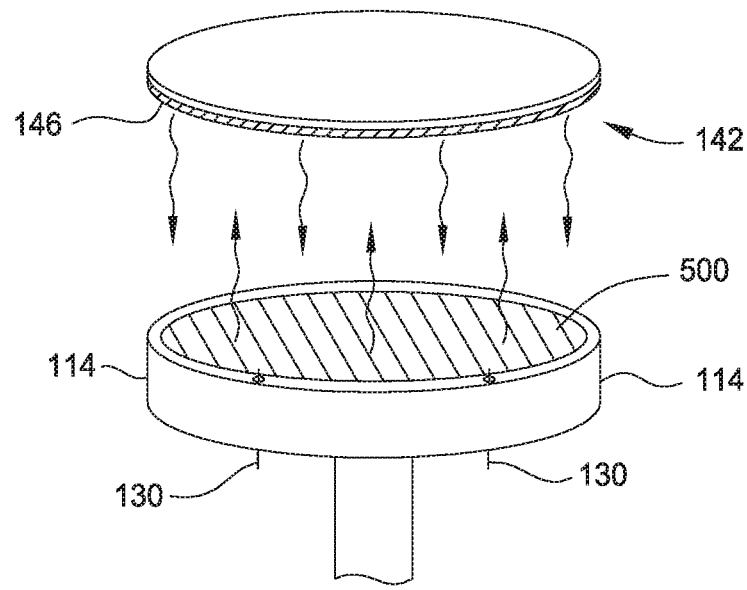
FIG. 7 is schematic isometric view of a substrate support body adjacent to one embodiment of a showerhead assembly.

FIG. 7 is a schematic isometric view of a substrate support body 114 adjacent to a showerhead assembly 142. The showerhead assembly 142 includes a reflective faceplate 146. The reflective faceplate 146 may include a reflective coating or a reflective surface finish in order to provide reflected heat flux toward a substrate 500 disposed on the substrate lift pins 130 (and spaced away from the upper surface of the substrate support body 114). The reflected heat flux may facilitate temperature uniformity of the substrate 500 during a preheat process or a steady-state heating process as described above. In some embodiments, the reflective faceplate 146 reflects some of the radiative heat back to the substrate 500. This may help the substrate 500 to reach a higher preheat temperature faster. This can also provide preheating the substrate 500 at a greater distance from the surface of the substrate support body 114 while also reducing sagging of the edges of the substrate 500. The reflective faceplate 146 may comprise a nickel coating.

FIG. 8 is a schematic cross-sectional view of one embodiment of a substrate support body 114. Substrate lift pins are not shown in this view. In this embodiment, an upper surface 700 of the substrate support body 114 is profiled to provide differential conductive heating. For example, a dished area 705 is formed between a raised central region 710 and a raised peripheral region 715. The raised central region 710 and the raised peripheral region 715 may be utilized to support the center of the substrate 500 and the edge of the substrate 500, respectively, during a steady-state heating process. In some embodiments, the dished area 705 may include dimples or projections 720. The projections 720 may be radially-oriented ribs or ring-shaped (continuous or discontinuous).

The raised central region 710 may be utilized to maintain temperatures of the substrate 500 at the center thereof to compensate for heat losses through the shaft 118. In the conventional substrate supports, areas of the substrate adjacent to the shaft are center cold but the raised central region 710 may minimize temperature non-uniformity by compensating for heat loss through the shaft 118.

FIG. 9 is a schematic cross-sectional view of another embodiment of a substrate support body 114. Substrate lift pins are not shown in this view. In this embodiment, an upper surface 700 of the substrate support body 114 is profiled to provide differential conductive heating. For example, projections 720 are formed on the upper surface 700. The projections 720 may be shorter in the central region compared to a length of the projections 720 moving radially outward from the central region.

The shorter projections 720 at the central region may be utilized to maintain temperatures of the substrate 500 at the center thereof to compensate for heat losses through the shaft 118.

Figure 10:
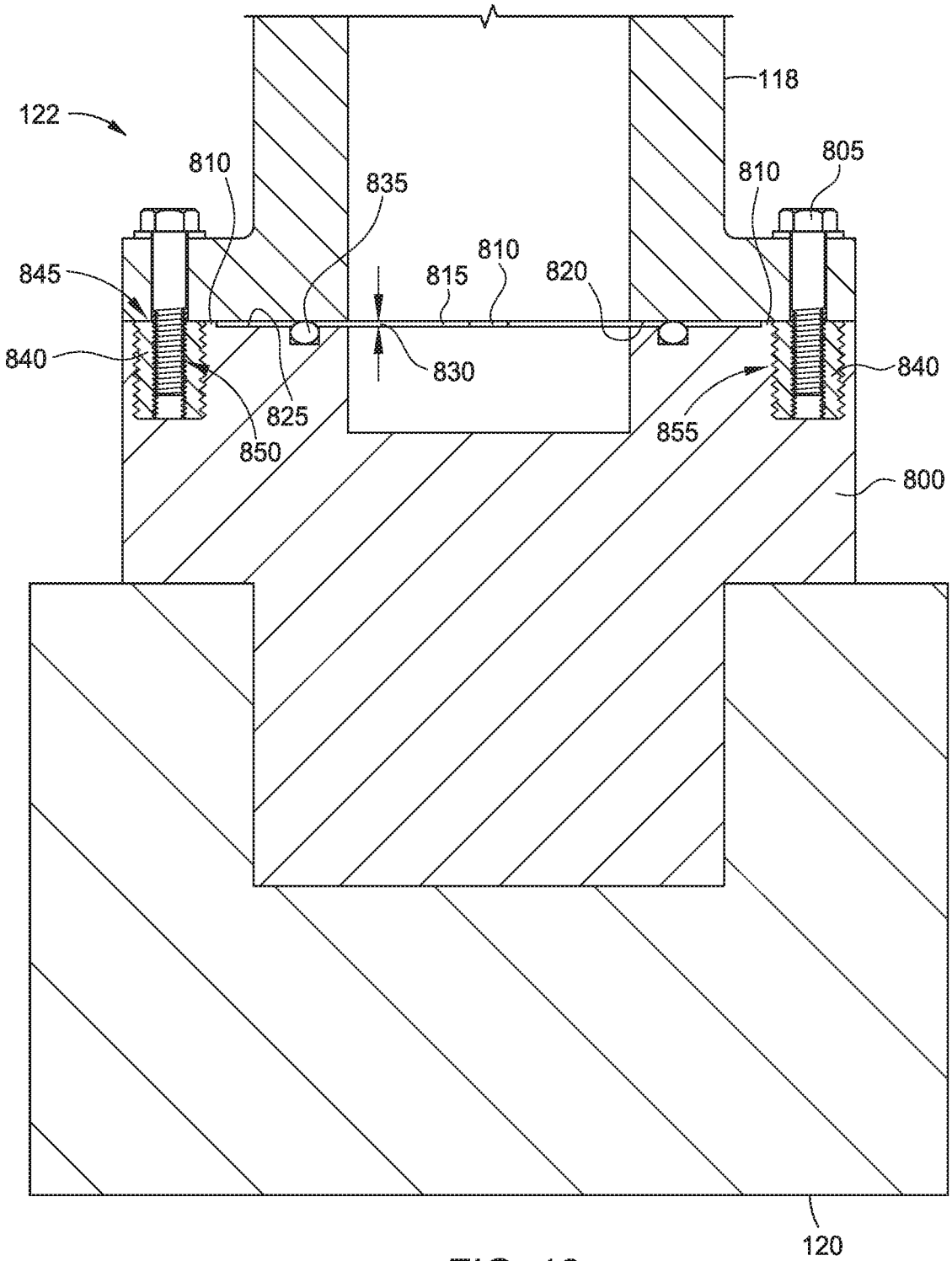
FIG. 10 is a cross-sectional view of a bi-metal base assembly that may be used in the substrate processing system of FIG. 1.

FIG. 10 is a cross-sectional view of the base assembly 122 that may be used in the substrate processing system 100 of FIG. 1. The base assembly 122 includes the shaft 118 and an adapter body 800 that couples to the power box 120. The adapter body 800 is made of a material having low thermal conductivity properties, such as stainless steel. The shaft 118 is coupled to the adapter body 800 by fasteners 805. Each of the fasteners 805 are threaded into the adapter body 800 at positions corresponding to a protruding surface or a raised boss 810. Areas between the raised bosses 810 define a gap 815 between a lower surface 820 of the shaft 118 and an upper surface 825 of the adapter body 800. The gap 815 reduces contact between the shaft 118 and the adapter body 800 which reduces conductive heat transfer therebetween. In one example, the gap 815 comprises a dimension 830 of about 0.002 inches to about 0.008 inches, for example between about 0.004 inches to about 0.006 inches. A seal 835, such as an O-ring is also disposed between the lower surface 820 of the shaft 118 and the upper surface 825 of the adapter body 800. Thus, conductive heat transfer between the adapter body 800 and the shaft 118 is limited to the areas adjacent to the raised bosses 810 and the seal 835. Conductive heat transfer between the adapter body 800 and the shaft 118 is also limited by the material of the adapter body 800.

The adapter body 800 is a bi-metal member having threaded metallic inserts 840 provided in openings 845 formed in the raised bosses 810. Each of the threaded metallic inserts 840 are an austenitic stainless steel alloy, such as a nitrided stainless steel sold under the trade name NITRONIC®. Each of the threaded metallic inserts 840 are threaded into a respective opening 845, and the threaded metallic inserts 840 include a first threaded interface 850 that couples with each of the fasteners 805. Each of the threaded metallic inserts 840 are made of a material that is less susceptible to galling when forming the first threaded interface 850 for the fasteners 805 as compared with stainless steel. For example, the threaded interface 850 includes threads that are finer than threads of a second threaded interface 855 for coupling the adapter body 800 to the threaded metallic inserts 840. Thus, the threaded metallic inserts 840 provides finer threads for the fasteners 805 while minimizing galling. The second threaded interface 855 includes coarser threads than the first threaded interface 850, and the coarser threads of the second threaded interface 855 is less likely to gall the stainless steel material in the openings 845 of the adapter body 800.

Figure 11:
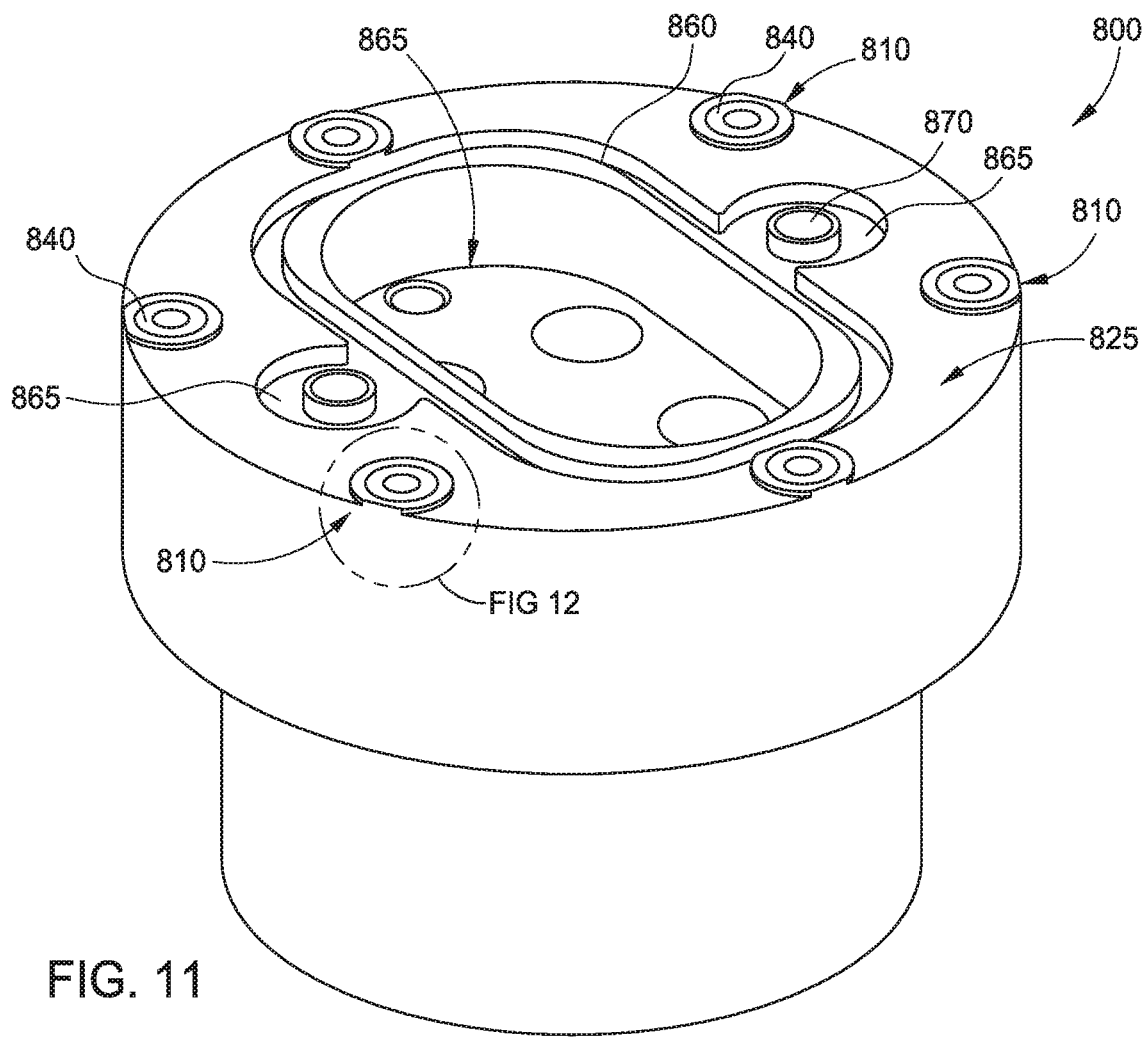
FIG. 11 is an isometric view of the adapter body of FIG. 10.

FIG. 11 is an isometric view of the adapter body 800. A plurality of the raised bosses 810 are shown about a periphery of the upper surface 825 of the adapter body 800. A groove 860 as well as two circular grooves 865 are shown formed in the upper surface 825 of the adapter body 800. The groove 860 and the grooves 865 are sized to receive the seal 835 of FIG. 10. A recessed area 865 is formed in the adapter body 800 inside the groove 860. The recessed area 865 includes a plurality of openings for fluids, power lines and/or thermocouple leads. Each of the grooves 865 include an opening 870 that may be used for fluids, power lines and/or thermocouple leads.

Figure 12:
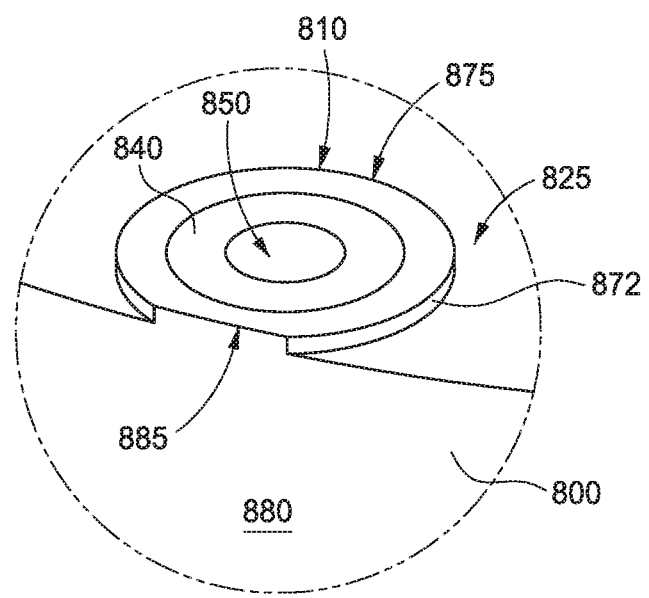
FIG. 12 is an enlarged view of a portion of the adapter body of FIG. 11.

FIG. 12 is an enlarged view of a portion of the adapter body 800 of FIG. 11. One of the raised bosses 810 is shown, but is indicative of other raised bosses 810 formed on the adapter body 800. The raised boss 810 includes a protruding wall 872 that extends orthogonally from the upper surface 825 of the adapter body 800. A height of the protruding wall 872 is equal to the dimension 830 of the gap 815 shown and described in FIG. 10. The protruding wall 872 includes a first radius 875 proximal to the upper surface 825 of the adapter body 800. The protruding wall 872 also interfaces with a peripheral surface 880 of the adapter body 800 at a second radius 885 that is the same as the outer diameter of the peripheral surface 880 of the adapter body 800. The second radius 885 is greater than the first radius 875.

Testing of the base assembly 122 coupled to the substrate support body 114 by the shaft 118 as described herein using the adapter body 800 showed reduced conductive heat loss along the shaft 118. For example, in one test in a process at about 425 degrees Celsius, the temperature measured at the base assembly 122 was about 80 degrees Celsius less than the temperature measured at a conventional base assembly.

While the foregoing is directed to embodiments of the present disclosure, other and further embodiments of the disclosure may be devised without departing from the basic scope thereof, and the scope thereof is determined by the claims that follow.

The invention claimed is:

1. A semiconductor processing chamber, comprising:
a chamber body having a bottom and a sidewall defining an interior volume, the sidewall having a substrate transfer port formed therein;
a substrate support and a showerhead positioned in the interior volume; and
a plurality of absorber bodies disposed in the interior volume, the plurality of absorber bodies occupying only a portion of the interior volume opposing the substrate transfer port, each absorber body being supported by one or more stand-off pins spacing each absorber body away from the bottom, wherein each absorber body is shaped as a portion of an arc.

2. The chamber of claim 1, wherein the plurality of absorber bodies consists of two members having a major surface in plan view disposed in a plane that is parallel to a supporting surface of the substrate support.

3. The chamber of claim 1, wherein each absorber body comprises a material that absorbs infrared radiation in the 2 micron to 7 micron range.

4. The chamber of claim 1, wherein the substrate support has a profiled upper surface.

5. The chamber of claim 4, wherein the profiled upper surface comprises a plurality of projections formed on a substrate receiving surface of the substrate support.

6. The chamber of claim 5, wherein the substrate receiving surface includes a central region and the projections have a length that increases from the central region to a peripheral region thereof.

7. The chamber of claim 4, wherein the profiled upper surface comprises a dished area formed between a raised central region and a raised peripheral region of a substrate receiving surface of the substrate support.

8. The chamber of claim 1, further comprising: a reflective faceplate coupled to the showerhead facing an upper surface of the substrate support.

9. The chamber of claim 1, wherein the substrate support includes a first region facing the substrate transfer port, and a second region and a third region adjacent to the first region, and the substrate support further comprises lift pins which are positioned disproportionally in or on the second and third region.

10. The chamber of claim 1, wherein the substrate support is coupled to a shaft and a base assembly, the base assembly including an adapter body including a plurality of raised surfaces and gaps adapted to reduce thermal transfer between the shaft and the adapter body.

11. A semiconductor processing chamber, comprising:
a chamber body having a bottom and a sidewall defining an interior volume, the sidewall having a substrate transfer port formed therein;
a substrate support disposed in the interior volume; and
a plurality of absorber bodies positioned in the interior volume about the substrate support in a position occupying only a portion of the interior volume opposing the substrate transfer port, each of the absorber bodies being supported by one or more stand-off pins spacing the respective absorber body away from the bottom, wherein each of the absorber bodies comprises a black material having a horseshoe shape in plan view and includes a first portion and a second portion, the first portion being thicker than the second portion.

12. The chamber of claim 11, wherein the substrate support includes a profiled upper surface.

13. The chamber of claim 12, wherein the profiled upper surface comprises a plurality of projections formed on a substrate receiving surface of the substrate support.

14. The chamber of claim 13, wherein the substrate receiving surface includes a central region and the projections have a length that increases from the central region to a peripheral region thereof.

15. The chamber of claim 12, wherein the profiled upper surface comprises a dished area formed between a raised central region and a raised peripheral region of a substrate receiving surface of the substrate support.

16. The chamber of claim 11, further comprising:
a showerhead positioned over the substrate support;
a reflective faceplate coupled to the showerhead facing an upper surface of the substrate support.

17. The chamber of claim 11, wherein the substrate support includes a first region facing the substrate transfer port, and a second region and a third region adjacent to the first region, and the substrate support further comprises lift pins which are positioned disproportionally in or on the second and third region.

18. A semiconductor processing chamber, comprising:
a chamber body having a bottom and a sidewall defining an interior volume, the sidewall having a substrate transfer port formed therein; and
a substrate support and a showerhead disposed in the interior volume, the substrate support including a first segment facing the substrate transfer port, and a second segment and a third segment adjacent to the first segment, wherein an absorber body is positioned in the interior volume adjacent to both of the second segment and the third segment, and wherein the absorber body occupies only a portion of the interior volume opposite the substrate transfer port, and wherein the absorber body comprises an anodized material that absorbs infrared radiation in the 2 micron to 7 micron range and includes a first portion and a second portion, the first portion being thicker than the second portion, and the absorber body is shaped as a partial arc in plan view.

* * * * *